US006769534B2

(12) United States Patent
Lee

(10) Patent No.: US 6,769,534 B2
(45) Date of Patent: Aug. 3, 2004

(54) APPARATUS FOR TRANSFERRING PRINTED CIRCUIT BOARD

(75) Inventor: Byung Joon Lee, Kyungki-do (KR)

(73) Assignee: Mirae Corporation, Choongchungnam-Do (KR)

( * ) Notice: Subject to any disclaimer, the term of this patent is extended or adjusted under 35 U.S.C. 154(b) by 0 days.

(21) Appl. No.: 10/298,561

(22) Filed: Nov. 19, 2002

(65) Prior Publication Data
US 2003/0094348 A1 May 22, 2003

(30) Foreign Application Priority Data
Nov. 22, 2001 (KR) .............................. 10-2001-0072849

(51) Int. Cl.[7] .............................................. B65G 15/10
(52) U.S. Cl. .................................. 198/817; 198/861.1
(58) Field of Search ............................ 198/817, 341.04, 198/341.05, 465.3, 861.1

(56) References Cited

U.S. PATENT DOCUMENTS

| 4,754,867 | A | * | 7/1988 | De Anda | 198/464.2 |
|---|---|---|---|---|---|
| 5,259,495 | A | * | 11/1993 | Douglas | 198/404 |
| 6,189,674 | B1 | * | 2/2001 | Izumida et al. | 198/341.01 |
| 6,453,548 | B1 | * | 9/2002 | Hidese | 29/832 |
| 6,663,712 | B2 | * | 12/2003 | Doyle et al. | 118/301 |
| 6,688,458 | B2 | * | 2/2004 | Prentice et al. | 198/502.2 |

* cited by examiner

Primary Examiner—Richard Ridley
(74) Attorney, Agent, or Firm—Fleshner & Kim, LLP

(57) ABSTRACT

The present invention discloses an apparatus for transferring a printed circuit board in which printed circuit boards having various sizes can be transferred by using one transfer apparatus. The apparatus for transferring a printed circuit board includes: a base plate; a plurality of linear motion guides installed to both sides of the base plate with a constant distance; first and second linear motion blocks installed slidably to the linear motion guides; a conveyor means reached in good condition on frames of the first and second motion blocks and having first and second conveyors for moving/supporting the printed circuit board; driving means for driving the first and second conveyors, respectively; a width direction transfer means of the conveyor means comprising: servo motors; moving blocks connected to the servo motors and fixed to a lower portion of the conveyor frame; fixing blocks installed to both sides of the base plate and connected to the moving blocks; and ball screws for interconnecting the moving blocks and the fixing blocks.

24 Claims, 9 Drawing Sheets

APPARATUS FOR TRANSFERRING PRINTED CIRCUIT BOARD

BACKGROUND OF THE INVENTION

1. Field of the Invention

The present invention relates to an apparatus for transferring a printed circuit board, more particularly, to an apparatus for transferring a printed circuit board in which printed circuit boards having various sizes can be transferred by using one transfer apparatus.

2. Description of the Background Art

A large number of electronic components electrically connected with each other are mounted on a surface of a printed circuit board. The mounting of the electronic components is performed by a surface mounting apparatus, and the mounting method of the electronic components comprises the steps of: supplying a printed circuit board (hereinafter, referred to a "board"); transferring the supplied board; mounting the electronic components on the board; and discharging the board mounted the electronic component.

As shown in FIG. 1, the mounting apparatus of electronic components according to a conventional art comprises: a plurality of conveyors C1, C2 and C3 arranged in a line for transferring the board P; an electronic component feeding device 1 installed to at least one side of the conveyor C2 being mounted the electronic component among the plurality of conveyors C1, C2 and C3 and loaded the electronic component 2; mounting heads 3 and 3' for mounting the electronic component 2 to the board P by picking the electronic component 2 from the electronic component feeding device 1; and a support means (not shown) for supporting the board transferred from a lower side of the mounting area of the electronic component to the mounting area.

The conveyors C1, C2 and C3 have belts B1, B2 and B3 being mounted on both sides thereof at regular intervals.

A first conveyor C1 among the conveyors C1, C2 and C3 is a charge buffer conveyor for charging the board, a third conveyor C3 positioned at the other side is a discharge buffer conveyor for discharging the board mounted the electronic components, and a second conveyor C2 between the first and third buffer conveyors is a mounting conveyor for mounting the electronic component. The respective conveyors C1, C2 and C3 are operated independently by a driving means (not shown), respectively.

The heads 3 and 3' are moved at X and Y shafts by frames of X and Y shafts and suck the electronic component in the electronic component feeding device 1 by vacuum, so that the electronic component is mounted to the board.

At this time, when the first and second mounting heads 3 and 3' perform the mounting work simultaneously, since an interruption between the mounting heads may be occurred, the first and second mounting heads perform the mounting work sequentially, not simultaneously. The board P completed the mounting work of the electronic components is carried out by the third conveyor C3.

However, according to the electronic component mounting method of the conventional art, there are several disadvantages as follows.

Since the width of the conveyor, a transfer apparatus of the board P, can not be controlled and a working area also can not be moved, the boards having widths of various sizes can not be transferred by one conveyor. Accordingly, since plural conveyors matching to the width of each board are required, the cost for purchasing and maintaining the board is needed much and a large quantity of manpower are needed.

SUMMARY OF THE INVENTION

Accordingly, it is a primary object of the present invention to provide an apparatus for transferring a printed circuit board in which printed circuit boards having various widths can be transferred safely by using one transfer apparatus.

Another object of the present invention is to provide an apparatus for transferring a printed circuit board in which the printed circuit board can be transferred easily to a desired working area.

In one aspect of the present invention, to achieve the above-described objects of the invention, there is provided an apparatus for transferring a printed circuit board comprising: a base plate; a plurality of linear motion guides installed to both sides of the base plate with a constant distance; first and second linear motion blocks installed slidably to the linear motion guides; a conveyor means reached in good condition on frames of the first and second motion blocks and having first and second conveyors for moving/supporting the printed circuit board; driving means for driving the first and second conveyors, respectively; a width direction transfer means of the conveyor means comprising: servo motors; moving blocks connected to the servo motors and fixed to a lower portion of the conveyor frame; fixing blocks installed to both sides of the base plate and connected to the moving blocks; and ball screws for interconnecting the moving blocks and the fixing blocks.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An apparatus for transferring a printed circuit board in accordance with preferred embodiments of the present invention will now be described in detail with reference to the accompanying drawings.

Figure 1:
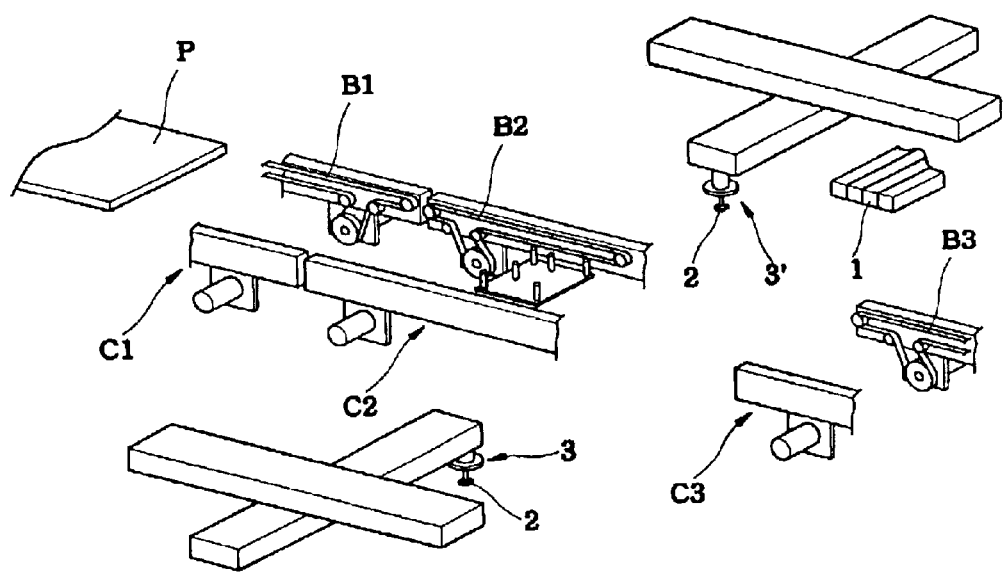
FIG. 1 is a conceptual view illustrating the mounting work of electronic components according to a conventional art.
Figure 2:
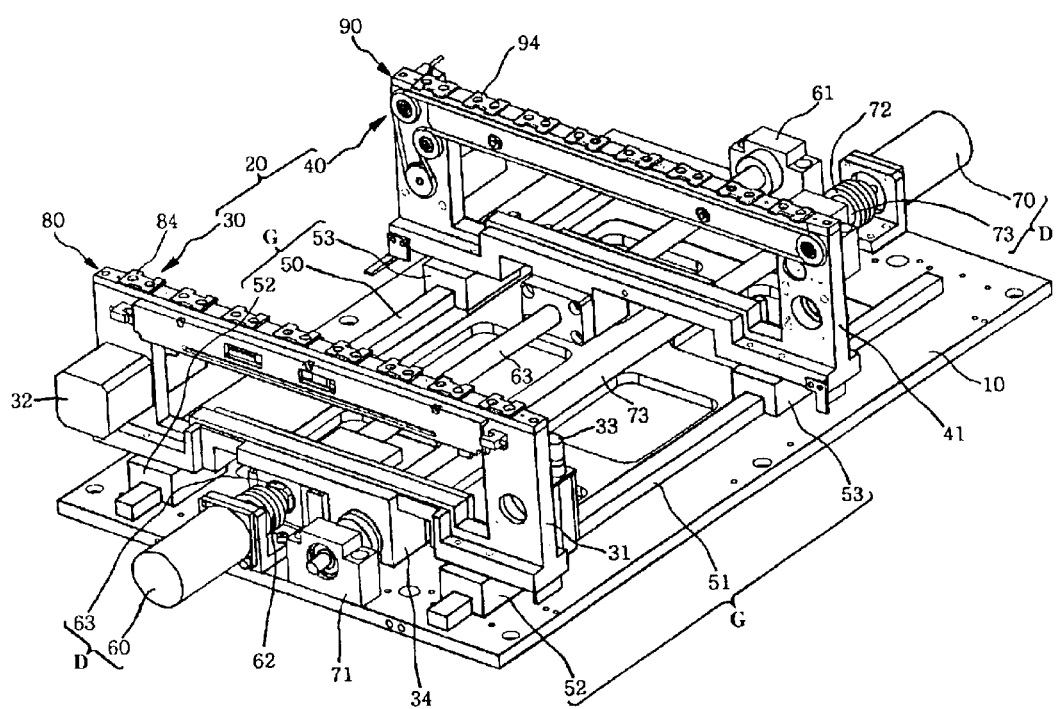
FIG. 2 is a perspective view illustrating an apparatus for transferring a printed circuit board according to the present invention.
Figure 3:
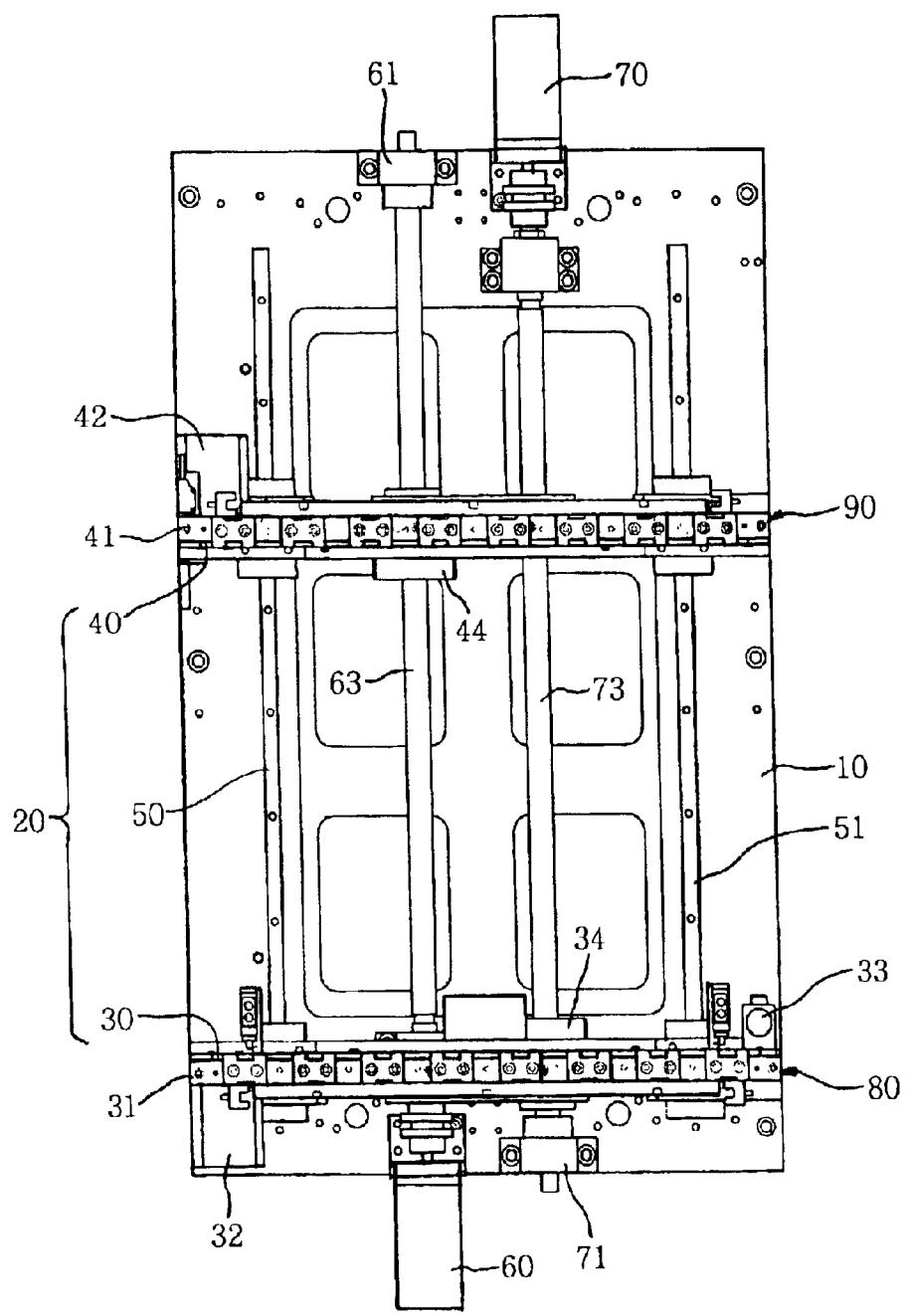
FIG. 3 is a plane view illustrating an apparatus for transferring a printed circuit board according to the present invention.

FIG. 2 is a perspective view illustrating an apparatus for transferring a printed circuit board according to the present invention and FIG. 3 is a plane view illustrating an apparatus for transferring a printed circuit board according to the present invention.

As shown in FIGS. 2 and 3, the printed circuit board transfer apparatus comprises: a base plate 10; a conveyor means 20 installed on the base plate 10 by a line, capable of controlling its width, for supporting and transferring the printed circuit board P; a guide means G for guiding a transfer of the conveyor 20; and a driving means D for enabling the conveyor 20 to move toward a width direction.

First, the conveyor means 20 is installed to a side of frames 31 and 41 installed to an upper surface of the base plate 10 and comprises first and second conveyors 30 and 40 capable of moving toward a horizontal direction, which both bottom surfaces of the printed circuit board P are reached in good condition on the conveyors. As shown in FIG. 3, motors 32 and 42 are installed to one side of the frames 31 and 41, and the first and second conveyors 30 and 40 are driven by the motors 32 and 42. A stopper 33 is installed to an end of the first conveyor 30 for stopping the progress of the printed circuit board P.

The guide means G comprises: a pair of first and second LM (Linear Motion) guides 50 and 51 installed to an upper surface of the base plate 10; and first and second LM blocks 52 and 53 combined to the LM guides 50 and 51 slidably and fixed to the bottom surfaces of the frames 31 and 41 of the first and second conveyors 30 and 40.

The driving means D comprises: servo motors 60 and 70; and ball screws 63 and 73 in which one ends of the servo motors are idly installed to fixing blocks 61 and 71, the other ends of the servo motors are slidably penetrated and installed to moving blocks 34 and 44 fixed to the frames 31 and 41, wherein the ball screws are connected to driving shafts of the servo motors 60 and 70 by means of couplings 62 and 72, rotated by the rotation force of the servo motors 60 and 70, thereby enabling the moving blocks 34 and 44 to perform a straight-line motion.

Figure 4:
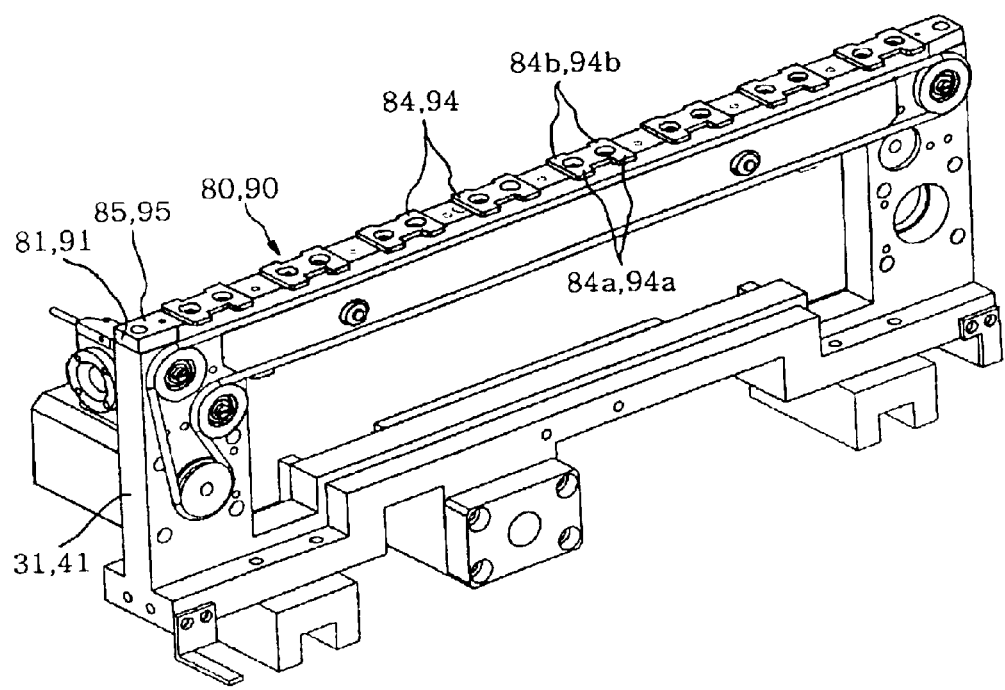
FIG. 4 is a perspective view illustrating pusher assemblies of first and second Y directions applied to an apparatus for transferring a printed circuit board according to the present invention.

As shown in FIGS. 2 and 4, pusher assemblies 80 and 90 of first and second Y directions are installed to the first and second conveyors 30 and 40 for supporting safely the transferred printed circuit board P from its side surface. In the Y direction pusher assemblies 80 and 90, as shown in FIG. 6, only one Y direction pusher assembly 80 can be installed to the first conveyor frame 31, and the first and second pusher assemblies 80 and 90 all can be installed to the first and second conveyor frames 31 and 41.

Figure 5:
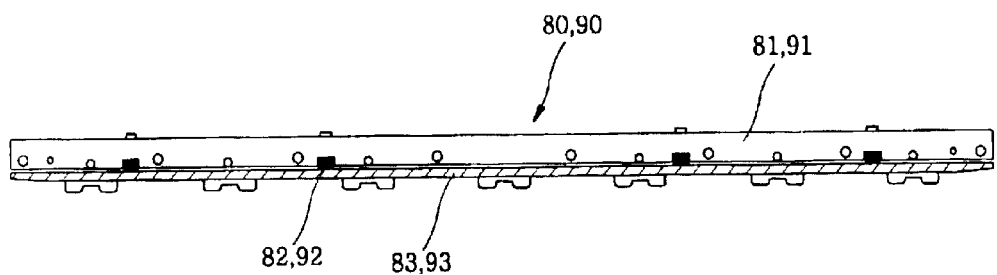
FIG. 5 is a perspective view illustrating pusher assemblies of first and second Y directions applied to an apparatus for transferring a printed circuit board according to the present invention.

As shown in FIGS. 4 and 5, the first and second pusher assemblies 80 and 90 comprise: fixing plates 81 and 91 fixed to upper surfaces of the conveyor frames 31 and 41, respectively; pushers 83 and 93 elastically supported to the inside of the fixing plates 81 and 91 by intervening coil springs 82 and 92 (shown in FIG. 5) for supporting elastically the printed circuit board from its side surface.

In the first and second pusher assemblies 80 and 90 and fixing frames 31 and 41, clamp blocks 84 and 94 for supporting the printed circuit board P from its upper side are installed to clamp assemblies 85 and 95.

Figure 7A:
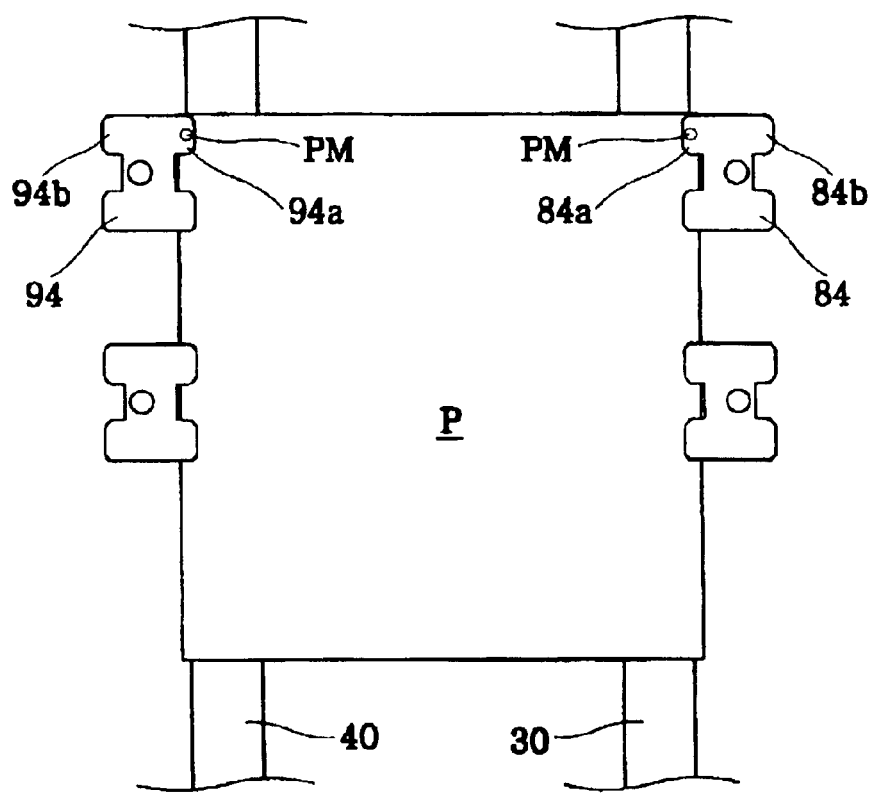
FIGS. 7a to 7c are views illustrating operating states of pusher assemblies of first and second Y directions according to the present invention.
Figure 7B:
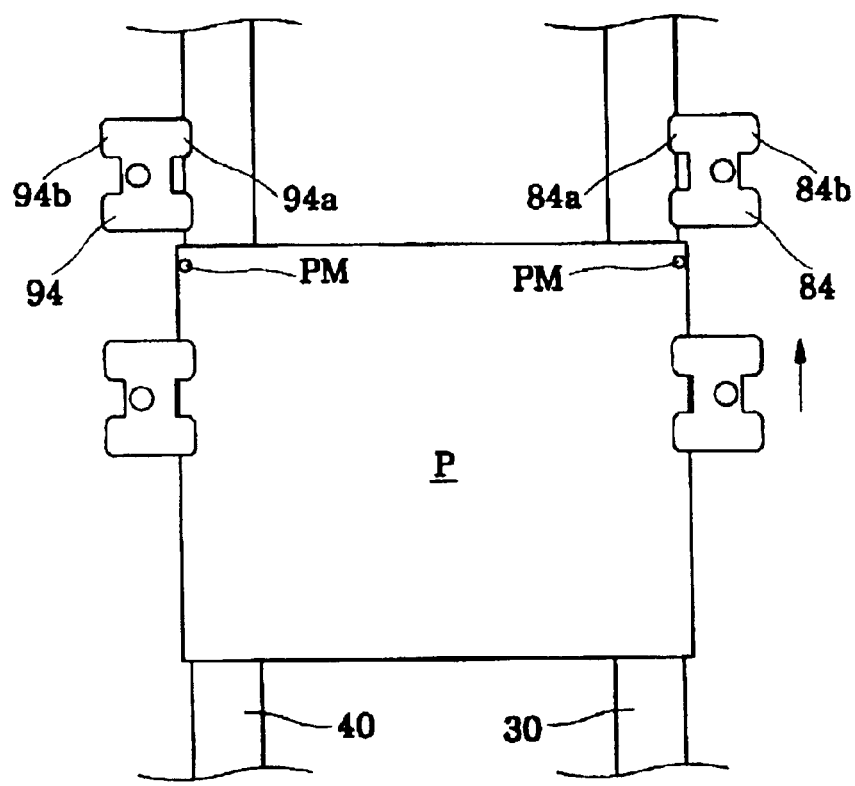
Figure 7C:
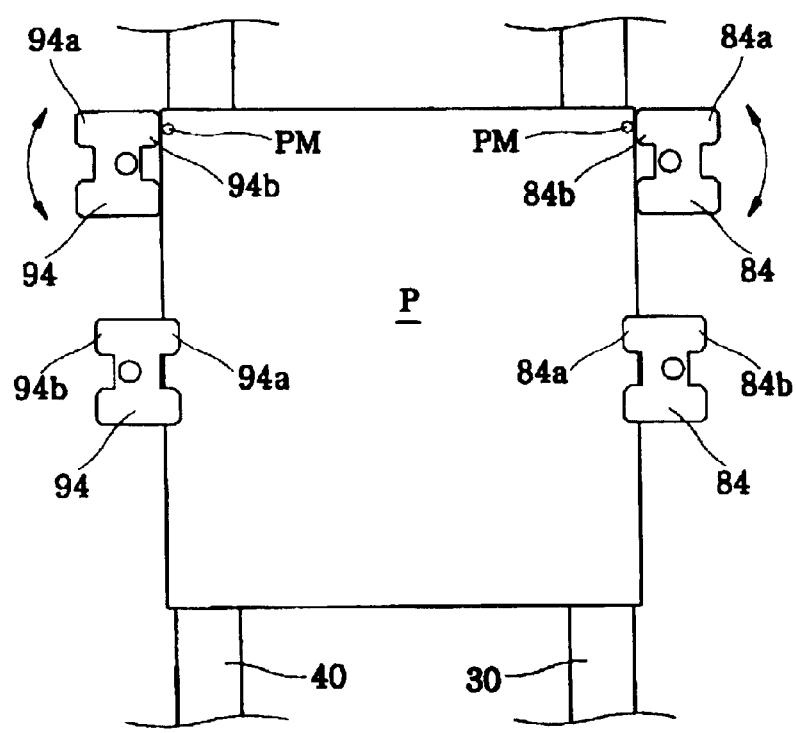

As shown in FIGS. 7a to 7c, support units 84a and 94a for supporting the printed circuit board from its upper surface are protruded from front and rear sides of the clamp blocks 84 and 94 horizontally, respectively. The clamp blocks 84 and 94 must support the printed circuit board P so that the PM (Point Marking) formed at the corner portion of the printed circuit board P may be recognized easily by a camera device (not shown) installed together with a mounting head. However, the PM of the printed circuit board P may be covered by the support units 84a and 94a of the clamp blocks 84 and 94 and at this time, the clamp blocks 84 and 94 can move by about 1 pitch from the clamp assemblies 85 and 95, so that the covered PM of the printed circuit board P may be recognized.

In another method, clamp blocks 84 and 94 have support units 84a, 84b, 94a and 94b with different lengths at both sides thereof, respectively, and can be rotated from the clamp assemblies 85 and 95. The long support units 84a and 94a are protruded by about 4 mm in plane in comparison with the clamp assemblies 85 and 95, the short support units 84b and 94b are protruded by about 2.4 mm in comparison with the clamp assemblies 84 and 94. Accordingly, when the clamp blocks 84 and 94 covering the point marking PM are rotated by 180°, the short support units 84b and 94b are arranged at an upper surface of the printed circuit board P, so that the point marking PM does not covered.

An operation of the printed circuit board transfer apparatus according to the present invention as constructed above will be described as follows.

As shown in FIGS. 2 and 3, before the printed circuit board P is transferred to the transfer apparatus from a charge buffer (not shown), the width between first and second conveyors 30 and 40 of a conveyor means 20 is controlled for matching to the width of the printed circuit board P.

When the width of the printed circuit board P is narrow than that between the first and second conveyors 30 and 40, positive polarity power is applied to servo motors 60 and 70, so the servo motors 60 and 70 are driven and ball screws 63 and 73 are rotated toward one direction by the rotation force of the servo motors 60 and 70.

The rotation force of the ball screws 63 and 73 is changed into a straight-line motion by moving blocks 34 and 44 and then moved along a straight line toward a direction being converged the first and second frames 31 and 41, so that a distance between the first and second conveyors 30 and 40 is narrowed.

The first and second frames 31 and 41 are moved by guiding the LM guide blocks 52 and 53 being slid along the LM guides 50 and 51.

When the distance between the first and second conveyors 30 and 40 is matched to the width of the printed circuit board P, the power applied to the servo motors 60 and 70 is cut off and then the first and second conveyors 30 and 40 are stopped.

According to the above method, the printed circuit boards P having various widths can be transferred by controlling the distance between the first and second conveyors 30 and 40.

Figure 6A:
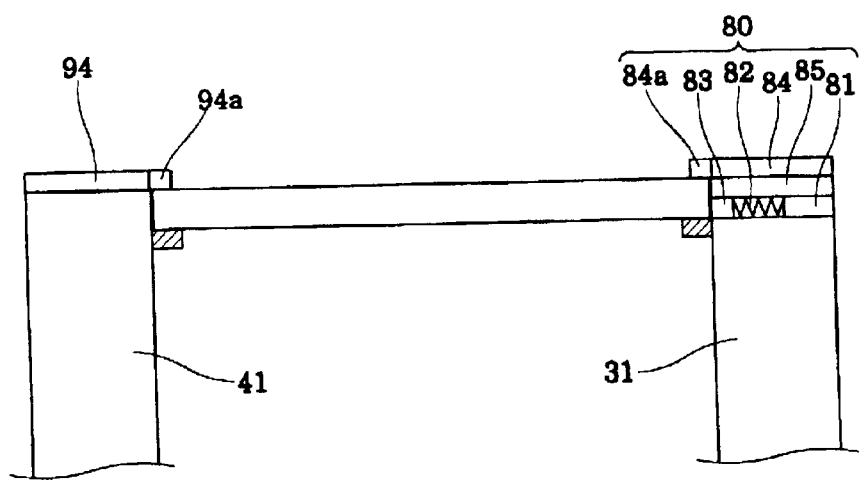
FIGS. 6a and 6b are front views illustrating an apparatus for transferring a printed circuit board according to the present invention.
Figure 6B:
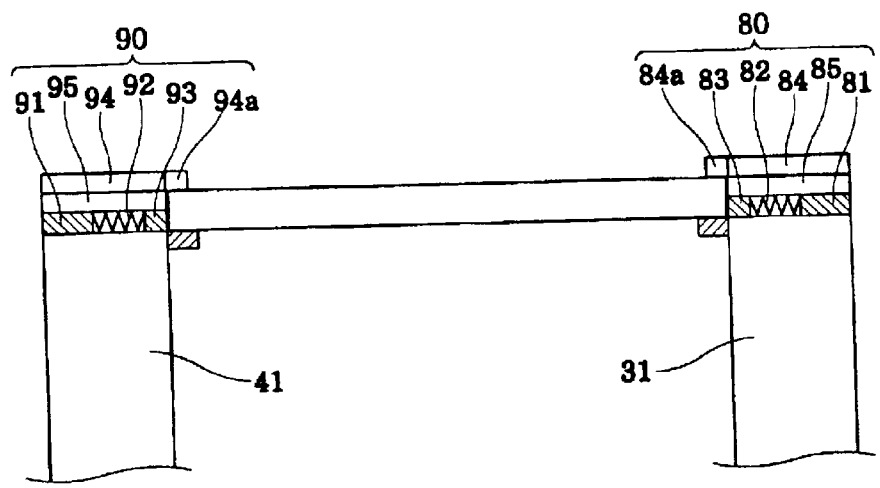

In a state that the printed circuit board P is put on the first and second conveyors 30 and 40, an end of the printed circuit board P, as shown in FIG. 6a, is supported elastically by a pusher 83 and simultaneously, clamped by a support unit 84a of the clamp block 84 and then transferred along the first and second conveyors 30 and 40. Also, in a state that the printed circuit board P is put on the first and second conveyors 30 and 40, both ends of the printed circuit board P, as shown in FIG. 6b, are supported elastically by pushers 83 and 93 and simultaneously, clamped by support units 84a and 94a 10 of the clamp blocks 84 and 94 and then transferred along the first and second conveyors 30 and 40.

As shown in FIG. 7a, in a state that the printed circuit board P is reached in good condition on the first and second conveyors 30 and 40, when the point marking PM formed at the corner portion of the printed circuit board P is covered by the support units 84a and 94a of the clamp blocks 84 and 94, since the camera device positioned with the mounting head cannot recognize the point marking PM, a mounting work of electronic components does not performed. There is an embodiment for preventing from occurring the above phenomenon, that is, as shown in FIG. 7b, the clamp blocks 84 and 94 is moved on the clamp assemblies 85 and 95 by one pitch, so that the PM of the printed circuit board is exposed. Also, in another method, as shown in FIG. 7c, the clamp blocks 84 and 94 covering the PM are rotated by 180°, so that the short support units 84b and 94b are placed toward the printed circuit board P and the PM is exposed.

When the control of the width of the first and second conveyors 30 and 40 is completed, the first and second conveyors 30 and 40 are rotated by the motors 32 and 42, respectively and so the printed circuit board P is transferred. When the printed circuit board P is reached to a mounting position, a stopper 33 is ascended and so the progress of the printed circuit board is blocked. In this state, the electronic components are mounted by a mounting head.

On the other hand, when the width of the printed circuit board P is wider than that between the first and second conveyors 30 and 40, negative polarity is applied to the servo motors 60 and 70 and ball screws 63 and 73 are rotated toward a direction that the width between the ball screws 63 and 73 is widen.

By the rotating force of the ball screws 63 and 73, the first and second frames 31 and 41 are moved along with a straight line, so the width between the frames 31 and 41 is widen, and then when the frames 31 and 41 are moved with a degree that the width of the frames is matched with the width of the printed circuit board P, the power applied to the servo motors 60 and 70 is cut off and then the conveyors 30 and 40 are stopped.

After controlling the width of the first and second conveyors 30 and 40, the operation of the first and second conveyors 30 and 40 is the same as the operation when the width of the first and second conveyors 30 and 40 is narrowed and will be omitted.

Accordingly, a pair of first and second conveyors 30 and 40 for transferring the printed circuit board P are installed movably, and since the width of the first and second conveyors 30 and 40 can be matched to the width of the printed circuit board P by controlling the distance between the first and second conveyors 30 and 40, there are no plural printed circuit board transfer apparatuses matching to the width of the printed circuit board P like the conventional art.

As discussed earlier, according to the printed circuit board transfer apparatus of the present invention, since the printed circuit boards having various sizes can be transferred by a simple work controlling the distance between the first and second conveyors according to the width of the printed circuit board, the cost for purchasing/maintaining apparatuses generated by possessing the transfer apparatuses matching to the printed circuit boards and labor etc. can be reduced and the printed circuit board can be moved to the position of a desired working area.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. An apparatus for transferring a printed circuit board, comprising:
    a base plate;
    a plurality of linear motion guides installed on the base plate;
    first and second linear motion blocks slidably installed on each of the plurality of linear motion guides;
    a conveyor device provided on first and second conveyor frames, wherein the first and second conveyor frames are mounted on the first and second linear motion blocks, and wherein the conveyor device is configured to move and to support the printed circuit board;
    a driver configured to drive the conveyor device; and
    a width adjustment device configured to adjust a width of the conveyor device, comprising:
        a pair of servo motors;
        a moving block coupled to each servo motor and fixed to a lower portion of one of the conveyor frames;
        a fixing block connected to each moving block; and
        a plurality of ball screws, wherein each ball screw is coupled to one of the servo motors, and wherein each ball screw connects one of the moving blocks to one of the fixing blocks.

2. The apparatus of claim 1, further comprising a pusher assembly configured to support the printed circuit when it is loaded on the conveyor device.

3. The apparatus of claim 2, wherein the pusher assembly comprises:
    fixing plates fixed to upper surfaces of the first and second conveyor frames; and
    pushers elastically supported at an inside of the fixing plates by intervening elastic members and configured to elastically support a side surface of the printed circuit board.

4. The apparatus of claim 2, wherein the pusher assembly further comprises at least one clamp assembly.

5. The apparatus of claim 4, wherein each clamp assembly comprises a plurality of clamp blocks configured to be slidably installed on the clamp assembly.

6. The apparatus of claim 5, wherein each clamp block comprises at least one support unit on each side of the clamp block, wherein the support units have different lengths, and wherein the clamp blocks are configured to rotate 180° within the clamp assembly.

7. The apparatus of claim 1, wherein the plurality of linear motion guides comprises at least a first linear motion guide and a second linear motion guide, wherein the first conveyor frame is mounted on the first linear motion block of the first linear motion guide and the first linear motion block of the second linear motion guide, and the second conveyor frame is mounted on the second linear motion block of the first linear motion guide and the second linear motion block of the second linear motion guide.

8. The apparatus of claim 7, wherein the conveyor device comprises a first conveyor mounted on the first conveyor frame and a second conveyor mounted on the second conveyor frame, and wherein the first and second conveyor frames mounted on the first and second linear motion blocks, respectively, are configured to slide along the linear motion guides so as to adjust a width of the conveyor device.

9. The apparatus of claim 5, wherein the position of each clamp block on the pusher assembly can be slidably adjusted by a distance equal to a length of one clamp block.

10. An apparatus for transferring a printed circuit board, comprising:
a base plate;
first and second linear motion guides installed on the base plate;
first and second linear motion blocks slidably installed on each linear motion guide;
a conveyor device configured to move and to support the printed circuit board, comprising a first conveyor frame mounted on the first linear motion blocks of the first and second linear motion guides, and a second conveyor frame mounted on the second linear motion blocks of the first and second linear motion guides; and
a pusher assembly mounted at an upper surface of one of the first conveyor frame and the second conveyor frame, wherein the pusher assembly is configured to secure the printed circuit board in the conveyor device, and wherein the pusher assembly comprises at least a clamp assembly, the clamp assembly comprising a plurality of clamp blocks configured to be slidably installed on the clamp assembly and to rotate 180° within the clamp assembly.

11. The apparatus of claim 10, further comprising a width adjustment device configured to adjust a width of the conveyor device, comprising:
a first servo motor and a second servo motor;
a first moving block coupled to the first servo motor and fixed to the first conveyor frame, and a second moving block coupled to the second motor and fixed to the second conveyor frame;
a first fixing block connected to the first moving block, and a second fixing block connected to the second moving block; and
a first ball screw configured to connect the first fixing block and the first moving block, and a second ball screw configured to connect the second fixing block and the second moving block, wherein the first and second conveyor frames mounted on the first and second linear motion blocks, respectively, are configured to slide along the linear motion guides so as to adjust a width of the conveyor device.

12. The apparatus of claim 10, wherein each pusher assembly further comprises a fixing plate, and a pusher elastically supported at an inner side of the fixing plate by intervening elastic members so as to elastically support a side surface of the printed circuit board.

13. The apparatus of claim 10, wherein each clamp block comprises at least one support units located on opposite sides of the clamp block, and wherein the support units have different lengths.

14. The apparatus of claim 13, wherein the position of each clamp block on the pusher assembly can be slidably adjusted by a distance equal to a length of one clamp block.

15. The apparatus of claim 10, wherein the pusher assembly comprises a first pusher assembly, and further comprising a second pusher assembly mounted at an upper surface of the other of the first and second conveyor frames, opposite the first pusher assembly, the second pusher assembly comprising:
a fixing plate fixed to an upper surface of the other of the first and second conveyor frames;
at least one pusher elastically supported at an inner side of the fixing plate by intervening elastic members and configured to elastically support a side surface of the printed circuit board; and
a clamp assembly, comprising a plurality of clamp blocks configured to be slidably installed on the clamp assembly and to rotate 180° within the clamp assembly.

16. An apparatus for transferring a printed circuit board, comprising:
a base plate;
at least one linear motion guide installed on the base plate;
at least one linear motion block installed on each at least one linear motion guide;
first and second conveyer frames, wherein each conveyer frame includes a movable conveyer belt configured to support an edge of a printed circuit board and configured to move the printed circuit board, and wherein one of the first and second conveyer frames is mounted on one of the at least one linear motion blocks; and
a conveyer width adjustment device, comprising:
at least one fixing block attached to the base plate,
at least one moving block attached to one of the first and second conveyer frames;
at least one motor attached to the base plate, and
at least one threaded ball screw, wherein each threaded ball screw has a first end rotatably mounted on a fixing block and a second end coupled to a motor, and wherein the threaded ball screw passes through a moving block and interacts with screw threads on the moving block such that rotation of the threaded ball screw causes the conveyer frame attached to the moving block to move along the at least one linear motion guide, to thereby adjust a spacing between the first and second conveyer frames.

17. The apparatus of claim 16, wherein the at least one linear motion guide comprises first and second linear motion guides, wherein the at least one linear motion block comprises first and second linear motion blocks installed, respectively, on the first and second linear motion guides, and wherein one of the first and second conveyer frames is installed on the first and second linear motion blocks.

18. The apparatus of claim 17, wherein the at least one fixing block comprises first and second fixing blocks, wherein the at least one moving block comprises first and second moving blocks, wherein the at least one motor comprises first and second motors, and wherein the at least one threaded ball screw comprises first and second ball screws.

19. The apparatus of claim 18, further comprising third and fourth linear motion blocks installed, respectively, on the first and second linear motion guides, wherein the other of the first and second conveyer frames is installed on the third and fourth linear motion blocks.

20. The apparatus of claim 19, wherein the first moving block is attached to the first conveyer frame, and wherein the second moving block is attached to the second conveyer frame such that rotation of the first ball screw will cause the first conveyer frame to move along the first and second linear motion guides and rotation of the second ball screw will cause the second conveyer frame to move along the first and second linear motion guides, to thereby adjust a spacing between the first and second conveyer frames.

21. The apparatus of claim 16, further comprising a clamp assembly attached to a top of at least one of the first and second conveyer frames, wherein the clamp assembly is configured to securely hold a printed circuit between the first and second conveyer frames.

22. The apparatus of claim 21, wherein the clamp assembly comprises a plurality of clamp blocks, each clamp block having at least one finger that is configured to project over a top surface of a printed circuit board held between the first and second conveyer frames to thereby securely hold the printed circuit board.

23. The apparatus of claim 22, wherein clamp block has a first finger projecting off one side of the clamp block and a second finger projecting off a second side of the clamp block, wherein the first finger has a different length than the second finger, and wherein the clamp block is rotatably mounted such that either the first finger or the second finger can be positioned over a printed circuit held between the first and second conveyer frames.

24. The apparatus of claim 16, further comprising a pusher assembly mounted on a top surface of at least one of the first and second conveyer frames, wherein the pusher assembly comprises:
 a pusher configured to contact a side surface of a printed circuit board held between the first and second conveyer frames; and
 a biasing member configured to bias the pusher towards an edge of the printed circuit board.

* * * * *